United States Patent
Parikh et al.

(10) Patent No.: US 7,355,215 B2
(45) Date of Patent: Apr. 8, 2008

(54) FIELD EFFECT TRANSISTORS (FETS) HAVING MULTI-WATT OUTPUT POWER AT MILLIMETER-WAVE FREQUENCIES

(75) Inventors: Primit Parikh, Goleta, CA (US); Yifeng Wu, Goleta, CA (US); Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 31 days.

(21) Appl. No.: 11/005,423

(22) Filed: Dec. 6, 2004

(65) Prior Publication Data
US 2006/0118823 A1  Jun. 8, 2006

(51) Int. Cl.
*H01L 29/739* (2006.01)

(52) U.S. Cl. .............. 257/194; 257/192; 257/E29.14; 257/E29.246; 257/E29.248; 257/E29.249

(58) Field of Classification Search .......... 257/20, 257/190, 192, 194, 195, 266, 267, 280, E29.246, 257/E29.247, E29.252, E29.14, E29.248, 257/E29.249
See application file for complete search history.

(56) References Cited

U.S. PATENT DOCUMENTS

| | | |
|---|---|---|
| 4,424,525 A | 1/1984 | Mimura |
| 4,471,366 A | 9/1984 | Delagebeaudeuf et al. |
| 4,727,403 A | 2/1988 | Hilda et al. |
| 4,755,867 A | 7/1988 | Cheng |
| 4,788,156 A | 11/1988 | Stoneham et al. |
| 4,946,547 A | 8/1990 | Palmour et al. |
| 5,053,348 A | 10/1991 | Mishra et al. |
| 5,172,197 A | 12/1992 | Nguyen et al. |
| 5,192,987 A | 3/1993 | Khan et al. |
| 5,200,022 A | 4/1993 | Kong et al. |
| 5,210,051 A | 5/1993 | Carter, Jr. |
| 5,296,395 A | 3/1994 | Khan et al. |
| 5,298,445 A | 3/1994 | Asano |
| RE34,861 E | 2/1995 | Davis et al. |
| 5,393,993 A | 2/1995 | Edmond et al. |

(Continued)

FOREIGN PATENT DOCUMENTS

EP    0 334 006 A1    9/1989

(Continued)

OTHER PUBLICATIONS

Y.-F. Wu, M. Moore, A. Saxler, P. Smith, P.M. Chavarkar and P. Parikh, 3.5-Watt AlGaN/GaN HEMTs and Amplifiers at 35 GHz, Dec. 8-10, 2003, IEDM '03 Technical Digest, pp. 23.5.1-23.5.3.*

(Continued)

*Primary Examiner*—Minhloan Tran
*Assistant Examiner*—Benjamin Tzu-Hung Liu
(74) *Attorney, Agent, or Firm*—Myers Bigel Sibley & Sajovec

(57) ABSTRACT

High electron mobility transistors (HEMT) are provided having an output power of greater than 3.0 Watts when operated at a frequency of at least 30 GHz. The HEMT has a power added efficiency (PAE) of at least about 20 percent and/or a gain of at least about 7.5 dB. The total width of the HEMT is less than about 6.0 mm.

50 Claims, 8 Drawing Sheets

U.S. PATENT DOCUMENTS

| | | | |
|---|---|---|---|
| 5,523,589 | A | 6/1996 | Edmond et al. |
| 5,534,462 | A | 7/1996 | Fiordalice et al. |
| 5,592,501 | A | 1/1997 | Edmond et al. |
| 5,686,737 | A | 11/1997 | Allen |
| 5,700,714 | A | 12/1997 | Ogilhara et al. |
| 5,701,019 | A | 12/1997 | Matsumoto et al. |
| 5,705,827 | A | 1/1998 | Baba et al. |
| 5,804,482 | A | 9/1998 | Konstantinov et al. |
| 5,885,860 | A | 3/1999 | Weitzel et al. |
| 5,946,547 | A | 8/1999 | Kim et al. |
| 5,966,520 | A * | 10/1999 | Buer et al. ............ 716/6 |
| 6,028,328 | A | 2/2000 | Riechert et al. |
| 6,046,464 | A | 4/2000 | Schetzina |
| 6,051,849 | A | 4/2000 | Davis et al. |
| 6,064,082 | A | 5/2000 | Kawai et al. |
| 6,086,673 | A | 7/2000 | Molnar |
| 6,150,680 | A | 11/2000 | Eastman et al. |
| 6,177,685 | B1 | 1/2001 | Teraguchi et al. |
| 6,177,688 | B1 | 1/2001 | Linthicum et al. |
| 6,218,680 | B1 | 4/2001 | Carter, Jr. et al. |
| 6,255,198 | B1 | 7/2001 | Linthicum et al. |
| 6,261,929 | B1 | 7/2001 | Gehrke et al. |
| 6,284,613 | B1 * | 9/2001 | Subrahmanyam et al. .. 438/307 |
| 6,316,793 | B1 | 11/2001 | Sheppard et al. |
| 6,376,339 | B2 | 4/2002 | Linthicum et al. |
| 6,380,108 | B1 | 4/2002 | Linthicum et al. |
| 6,429,467 | B1 | 8/2002 | Ando |
| 6,448,648 | B1 | 9/2002 | Boos |
| 6,462,355 | B1 | 10/2002 | Linthicum et al. |
| 6,486,042 | B2 | 11/2002 | Gehrke et al. |
| 6,489,221 | B2 | 12/2002 | Gehrke et al. |
| 6,492,669 | B2 | 12/2002 | Nakayama et al. |
| 6,515,316 | B1 | 2/2003 | Wojtowicz et al. |
| 6,521,514 | B1 | 2/2003 | Gehrke et al. |
| 6,545,300 | B2 | 4/2003 | Gehrke et al. |
| 6,548,333 | B2 | 4/2003 | Smith |
| 6,570,192 | B1 | 5/2003 | Davis et al. |
| 6,582,906 | B1 | 6/2003 | Cao et al. |
| 6,582,986 | B2 | 6/2003 | Kong et al. |
| 6,586,778 | B2 | 7/2003 | Linthicum et al. |
| 6,586,781 | B2 | 7/2003 | Wu et al. |
| 6,602,763 | B2 | 8/2003 | Davis et al. |
| 6,602,764 | B2 | 8/2003 | Linthicum et al. |
| 6,608,327 | B1 | 8/2003 | Davis et al. |
| 6,621,148 | B2 | 9/2003 | Linthicum et al. |
| 6,639,255 | B2 | 10/2003 | Inoue et al. |
| 6,686,261 | B2 | 2/2004 | Gehrke et al. |
| 6,706,114 | B2 | 3/2004 | Mueller |
| 2001/0015446 | A1 | 8/2001 | Inoue et al. |
| 2001/0017370 | A1 * | 8/2001 | Sheppard et al. ............ 257/24 |
| 2001/0020700 | A1 | 9/2001 | Inoue et al. |
| 2001/0023964 | A1 | 9/2001 | Wu et al. |
| 2001/0040246 | A1 | 11/2001 | Ishii |
| 2002/0008241 | A1 | 1/2002 | Edmond et al. |
| 2002/0017696 | A1 | 2/2002 | Nakayama et al. |
| 2002/0066908 | A1 | 6/2002 | Smith |
| 2002/0119610 | A1 | 8/2002 | Nishii et al. |
| 2002/0167023 | A1 | 11/2002 | Charvarkar et al. |
| 2003/0017683 | A1 | 1/2003 | Emrick et al. |
| 2003/0020092 | A1 | 1/2003 | Parikh et al. |
| 2003/0102482 | A1 | 6/2003 | Saxler |
| 2003/0123829 | A1 | 7/2003 | Taylor |
| 2003/0157776 | A1 | 8/2003 | Smith |
| 2003/0213975 | A1 | 11/2003 | Hirose et al. |
| 2004/0004223 | A1 | 1/2004 | Nagahama et al. |
| 2004/0012015 | A1 | 1/2004 | Saxler |
| 2004/0021152 | A1 | 2/2004 | Nguyen et al. |
| 2004/0029330 | A1 | 2/2004 | Hussain et al. |
| 2004/0061129 | A1 | 4/2004 | Saxler et al. |
| 2004/0241970 | A1 | 12/2004 | Ring |
| 2005/0006639 | A1 * | 1/2005 | Dupuis et al. ............ 257/20 |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |

OTHER PUBLICATIONS

Parikh, P. Wu, Y.-F. Chavarkar, P. Moore, M. Mishra, U.K. Sheppard, S. Smith, R.P. Saxler, A. Pribb W. Allen, S. Milligan, J. Palmour, J. "AlGaN-GaN HEMTs: material, device, circuit technology and applications." 2003 International Symposium on Compound Semiconductors: Post-Conference Proceedings p. 164-71 IEEE Aug. 25-27, 2003.*

Ambacher et al., "Two Dimensional Electron Gases Induced by Spontaneous and Piezoelectric Polarization Charges in N- and Ga-face AlGaN/GaN Heterostructures," *Journal of Applied Physics.* vol. 85, No. 6, pp. 3222-3233 (Mar. 1999).

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters.* vol. 33, No. 14, pp. 1230-1231 (1997).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics.* vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials.* vol. 28, No. 12, pp. 1420-1423 (1999).

Burm et al. "Recessed Gate GaN MODFETS," *Solid-State Electronics.* vol. 41, No. 2, pp. 247-250 (1997).

Burm et al. "Ultra-Low Resistive Ohmic Contacts on $n$-GaN Using Si Implantation," *Applied Physics Letters.* vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "C12 reactive ion etching for gate recessing of AlGaN/GaN field-effect transistors," *J. Vac. Sci. Technol. B.* vol. 17, No. 6, pp. 2755-2758 (1999).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices.* vol. 48, No. 3, pp. 479-485 (Mar. 2001).

Egawa et al. "Recessed gate ALGaN/GaN MODFET on Sapphire Grown by MOCVD," *Applied Physics Letters.* vol. 76, No. 1, pp. 121-123 (Jan. 2000).

Gaska et al. "Electron Transport in AlGaN/GaN Heterostructures Grown on 6H-SiC Substrates," *Applied Physics Letters.* vol. 72, No. 6, pp. 707-709 (Feb. 1998).

Gaska et al. "High-Temperature Performance of AlGaN/GaN HFET's on SiC Substrates," *IEEE Electron Device Letters.* vol. 18, No. 1, pp. 492-494 (Oct. 1997).

Gaska et al., "Self-Heating in High-Power AlGaN/GaN HFET's," *IEEE Electron Device Letters*. 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876.

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Heikman, Sten J., *MOCVD Growth Technologies for Applications in AlGaN/GaN High Electron Mobility Transistors*, Dissertation, University of California—Santa Barbara, Sep. 2002, 190 pages.

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kasahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p̄-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, 7th Wide-Gandgap III-Nitride Workshop (Mar. 2002).

Parikh et al., "Development of Gallium Nitride Epitaxy and Associated Material-Device Correlation for RF, Microwave and MM-wave Applications," Cree, Inc. (35 slides).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Saxler et al., "III-Nitride Heterostructures on High-Purity Semi-Insulating 4H-SiC Substrates for High-Power RF Transistors," International Workshop on Nitride Semiconductors (Jul. 19, 2004).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Samoff Symposium*, Pittsburgh, PA, Mar. 18, 1998.

Sullivan et al. "High-Power 10-GHz Operation of AlGaN HFET's on Insulating SiC," *IEEE Electon Device Letters*. vol. 19, No. 6, pp. 198-200 (Jun. 1998).

"Thick AIN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004.

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Co-Doping for Fermi Level Control in Semi-Insulating Group III Nitrides," U.S. Appl. No. 10/752,970, filed Jan. 7, 2004.

United States Patent Application entitled "Cap Layers and/or Passivation Layers for Nitride-Based Transistors, Transistor Structures and Methods of Fabricating the Same," U.S. Appl. No. 10/996,249, filed Nov. 23, 2004.

United States Patent Application entitled "Methods of Having Laterally Grown Active Region and Methods of Fabricating Same," U.S. Appl. No. 10/899,215, filed Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having A Hybrid Channel Layer Current Aperture Transistors and Methods of Fabricating Same" U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive And Insulating or Semi-Insulating Group III-Nitrides For Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al. "High Al-Content AlGaN/GaN MODFET's for Ultrahigh Performance," *IEEE Electron Device Letters*. vol. 19, No. 2, pp. 50-53 (Feb. 1998).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

* cited by examiner

FIELD EFFECT TRANSISTORS (FETS) HAVING MULTI-WATT OUTPUT POWER AT MILLIMETER-WAVE FREQUENCIES

STATEMENT OF GOVERNMENT INTEREST

The present invention was developed with Government support under contract number N00014-03-C-0092 awarded by ONR. The Government has certain rights in this invention.

FIELD OF THE INVENTION

The present invention relates to semiconductor devices and, more particularly, to field effect transistors (FETs).

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Recently, as discussed in *Bias-dependent Performance of High-Power AlGaN/GaN HEMTs* by Y.-F. Wu et al. (IEDM Technical Digest, pp. 378-380 (2001)) and *Influence of Barrier Thickness on the High-Power Performance of AlGaN/GaN HEMTs* by V. Tilak et al. (*IEEE Electron Dev. Lett.*, Vol. 22, No. 11, pp. 504-506 (November 2001)), after superior power capabilities such as greater than 10 W/mm at X band (8-12 GHz), GaN-based high electron mobility transistors (HEMTs) operating in the millimeter-wave frequency region are now being pursued. As discussed in Tilak, output powers of 2.3 W at 30 GHz was recently reported using a 360-μm-wide device. However, in previous designs, devices with larger gate peripheries exhibited a steep reduction in gain, which may limit the total output power per device.

SUMMARY OF THE INVENTION

Some embodiments of the present invention provide high electron mobility transistors (HEMT) having an output power of greater than 3.0 Watts when operated at a frequency of at least 30 GHz. In certain embodiments of the present invention the HEMT may have a power added efficiency (PAE) of at least about 20 percent and/or a gain of at least about 7.5 dB. The total width of the HEMT may be less than about 6.0 mm.

In further embodiments of the present invention, the HEMT may have an output power of at least about 3.6 Watts when operated at a frequency of about 30 GHz. HEMTs according to these embodiments of the present invention may have a power added efficiency of at least about 26 percent and a gain of at least about 6 dB.

In still further embodiments of the present invention, the HEMT may have an output power of at least about 3.45 Watts when operated at a frequency of about 35 GHz. In these embodiments of the present invention, the HEMT may have a power added efficiency of about 22 percent and a gain of at least about 4.9 dB. In certain embodiments of the present invention, the HEMT may be a Group III-nitride based HEMT.

In some embodiments of the present invention, the HEMT may include a GaN channel layer, an AlN layer on the GaN channel layer, an AlGaN layer on the AlN layer, a T-gate contact on the AlGaN layer, an insulating layer on a surface of the HEMT and source and drain contacts on the AlGaN layer. The insulating layer may be a silicon nitride (SiN) passivation layer. A base and a top of the T-gate contact may be about 0.2 μm and 0.7 μm, respectively. The HEMT may further include an air-bridge on the HEMT and may have fourteen gate fingers.

Further embodiments of the present invention provide field effect transistors (FET) having a total width of about less than about 6.0 mm and an output power greater than 3.0 Watts when operated at a frequency of at least 30 GHz. The FET may include a Group III-nitride based FET and/or a high electron mobility transistor (HEMT).

Still further embodiments of the present invention provide field effect transistors (FETs) having a total width of less than about 6.0 mm and a gain of at least about 7.5 dB when operated at a frequency of greater than about 30 GHz.

Transistors having various combinations and/or sub-combinations of transistor characteristics described above may also be provided according to some embodiments of the present invention.

DETAILED DESCRIPTION OF EMBODIMENTS OF THE INVENTION

Figure 1A:
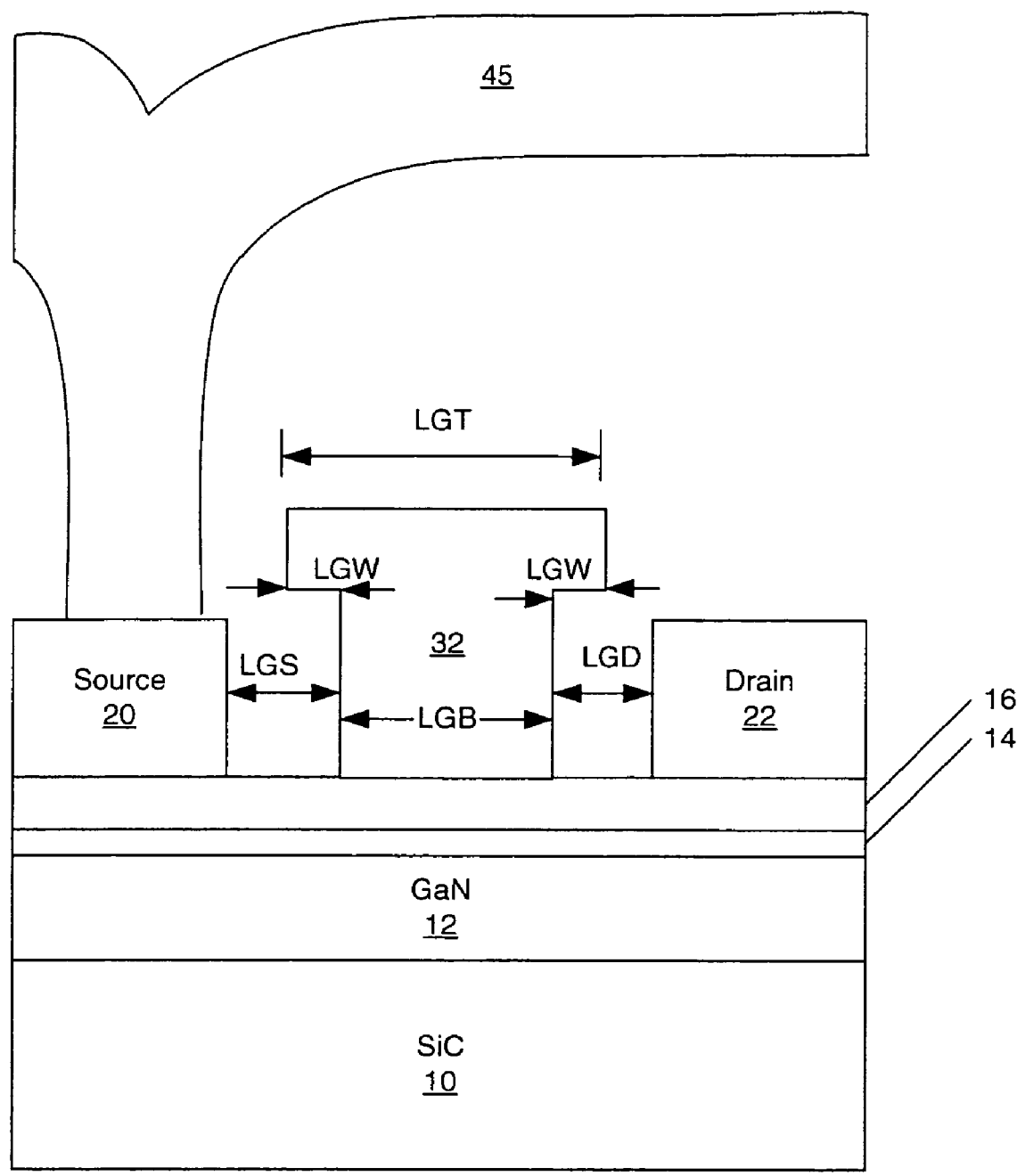
FIG. 1A is a cross-section illustrating a unit cell of transistors according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

While embodiments of the present invention are described with reference to particular structures, other structures and/or techniques for fabricating GaN-based HEMTs could also be utilized in some embodiments of the present invention. Such structures and/or techniques may include those described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAVING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849,589, filed May 20, 2004 and entitled "SEMICONDUCTOR DEVICES HAVING A HYBRID CHANNEL LAYER, CURRENT APERTURE TRANSISTORS AND METHODS OF FABRICATING SAME," U.S. Patent Publication No. 2003/0020092 filed Jul. 23, 2002 and published Jan. 30, 2003 for "INSULATING GATE ALGAN/GAN HEMT", and U.S. patent application Ser. No. 10/996,249, filed Nov. 23, 2004 and entitled "CAP LAYERS AND/OR PASSIVATION LAYERS FOR NITRIDE-BASED TRANSISTORS, TRANSISTOR STRUCTURES AND METHODS OF FABRICATING SAME," the disclosures of which are incorporated herein as if described in their entirety.

As will be discussed below with respect to FIGS. 1A through 12, devices according to some embodiments of the present invention provide 1.05 mm devices, scaled from sub 0.2-μm AlGaN/GaN HEMTs. These devices may provide on-chip single-stage amplifiers that exhibit gains of greater than 7.5 dB, as well as output powers of greater than 3.0 W when operated at a frequency of 30 GHz or greater. This multi-Watt output power at millimeter-wave frequencies may exceed the capabilities of conventional devices and may be comparable to devices about 6 or 7 times larger, for example, GaAs-based devices as discussed further herein.

Exemplary devices according to some embodiments of the present invention are schematically illustrated in FIGS. 1A through 4. However, embodiments of the present invention should not be construed as limited to the particular exemplary embodiments described herein but may include any suitable structure that provides transistor characteristics as described herein.

Referring now to FIG. 1A a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. Patent Publication No. 2003/0102482A1, filed Jul. 19, 2002 and published Jun. 5, 2003, and entitled "STRAIN BALANCED NITRIDE HETEROJUNCTION TRANSISTORS AND METHODS OF FABRICATING STRAIN BALANCED NITRIDE HETEROJUNCTION TRANSISTORS," or United States Patent Publication No. 2004/0012015 A1, filed Jul. 19, 2002 and published Jan. 22, 2004, and entitled "STRAIN COMPENSATED SEMICONDUCTOR STRUCTURES AND METHODS OF FABRICATING STRAIN COMPENSATED SEMICONDUCTOR STRUCTURES," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547;

5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Referring again to FIG. 1A, a channel layer 12 is provided on the substrate 10. The channel layer 12 may be deposited on the substrate 10 using buffer layers, transition layers, and/or nucleation layers as described above. The channel layer 12 may be under compressive strain. Furthermore, the channel layer 12 and/or buffer nucleation and/or transition layers may be deposited by MOCVD or by other techniques known to those of skill in the art, such as MBE or HVPE. In some embodiments of the present invention, the GaN buffer can be Fe doped in a manner similar to that described in Heikman et al., Appl. Phys. Lett., vol. 81, pp. 439-441, July 2002, the disclosure of which is incorporated herein by reference as if set forth in its entirety. In devices having Fe doped GaN buffers, the GaN buffer may be partially Fe doped, provided that the Fe concentration is very low, or less than about $1 \times 10^{16}/cm^2$, in the channel region, or about the 0.1 μm of the top of the GaN buffer.

The channel layer 12 is a Group III-nitride, and, in particular GaN. The channel layer 12 may be undoped ("unintentionally doped") and may be grown to a thickness of from about 1.0 to about 6.0 μm. In particular embodiments of the present invention, the channel layer 12 is GaN and has a thickness from about 1.0 to about 6.0 μm.

A barrier layer is provided on the channel layer 12. The channel layer 12 may have a bandgap that is less than the bandgap of the barrier layer and the channel layer 12 may also have a larger electron affinity than the barrier layer. The barrier layer may be deposited on the channel layer 12. In certain embodiments of the present invention, the barrier layer is provided by an AlN layer 14 and an AlGaN layer 16. The AlN layer 14 may have a thickness of from about 0.4 to about 1.2 nm. The AlGaN layer 16 may have a thickness of from about 15 to about 30 nm and an Al composition of from about 20 to about 35 percent. Examples of layers according to certain embodiments of the present invention are described in U.S. Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer is thick enough and has a high enough Al composition and doping to induce a significant carrier concentration at the interface between the channel layer 12 and the barrier layer through polarization effects. In particular embodiments of the present invention, the barrier layer comprises an AlN layer having a thickness of about 0.4 to about 0.8 nm and an AlGaN layer having greater than 25 percent Al and a thickness of about 15 to about 35 mm. The percentage of Al in the AlGaN layer is typically less than about 50 percent.

As further illustrated in FIG. 1A, the HEMT includes a source contact 20, a drain contact 22 and a gate contact 32 on the AlGaN layer 16. The source and drain contacts 22 and 24 can be made of different materials including but not limited to alloys of titanium, aluminum, or nickel. The gate contact 32 is a T-gate as illustrated in FIG. 1A and may be fabricated using conventional fabrication techniques. Suitable gate materials may depend on the composition of the AlGaN layer 16, however, in certain embodiments, conventional materials capable of making a Schottky contact to a nitride based semiconductor material may be used, such as Ni, Pt, $NiSi_x$, Cu, Pd, Cr, W and/or WSiN. Although not illustrated, a passivation layer may be blanket deposited on the structure of FIG. 1A. The passivation layer may be silicon nitride (SiN). References to SiN, SiON, $SiO_x$, MgN and the like refer to stoichiometric and/or non-stoichiometric materials. The T-gate 32 is defined by a bi-layer e-beam lithography process and has a footprint of approximately 0.18 μm.

In FIG. 1A, the distance from the gate contact 32 to the source contact 20 is indicated as $L_{GS}$, which may be about 0.7 μm. The distance from the gate contact 32 to the drain contact 22 is indicated as $L_{GD}$, which may be about 2.0 μm. The length of the T portion of the gate contact 32 is indicated as $L_{GT}$, which may be about 0.7 μm, the length of the base of the gate contact 32 is indicated as $L_{GB}$, which may be about 0.2 μm, the distance the wings of the T extend out from the base of the gate contact 32 is indicated as $L_{GW}$, which may be about 0.25 μm. The dimension of the gate contact 32 extending into and out of the page in FIG. 1A is referred to herein as the gate width $W_G$, which may be about 75 μm. A total width of the device may be 1.05 mm, or less than about 6.0 mm. Multiple cells may be placed in parallel to increase the total width of the device. The total width may also be referred to as the "periphery" of the combined device.

HEMTs according to exemplary embodiments of the present invention include multiple gate fingers, each having a width of about 75 μm. Embodiments of the present invention discussed herein include 14 gate fingers. The device has a total width of about 1.05 mm.

Figure 1B:
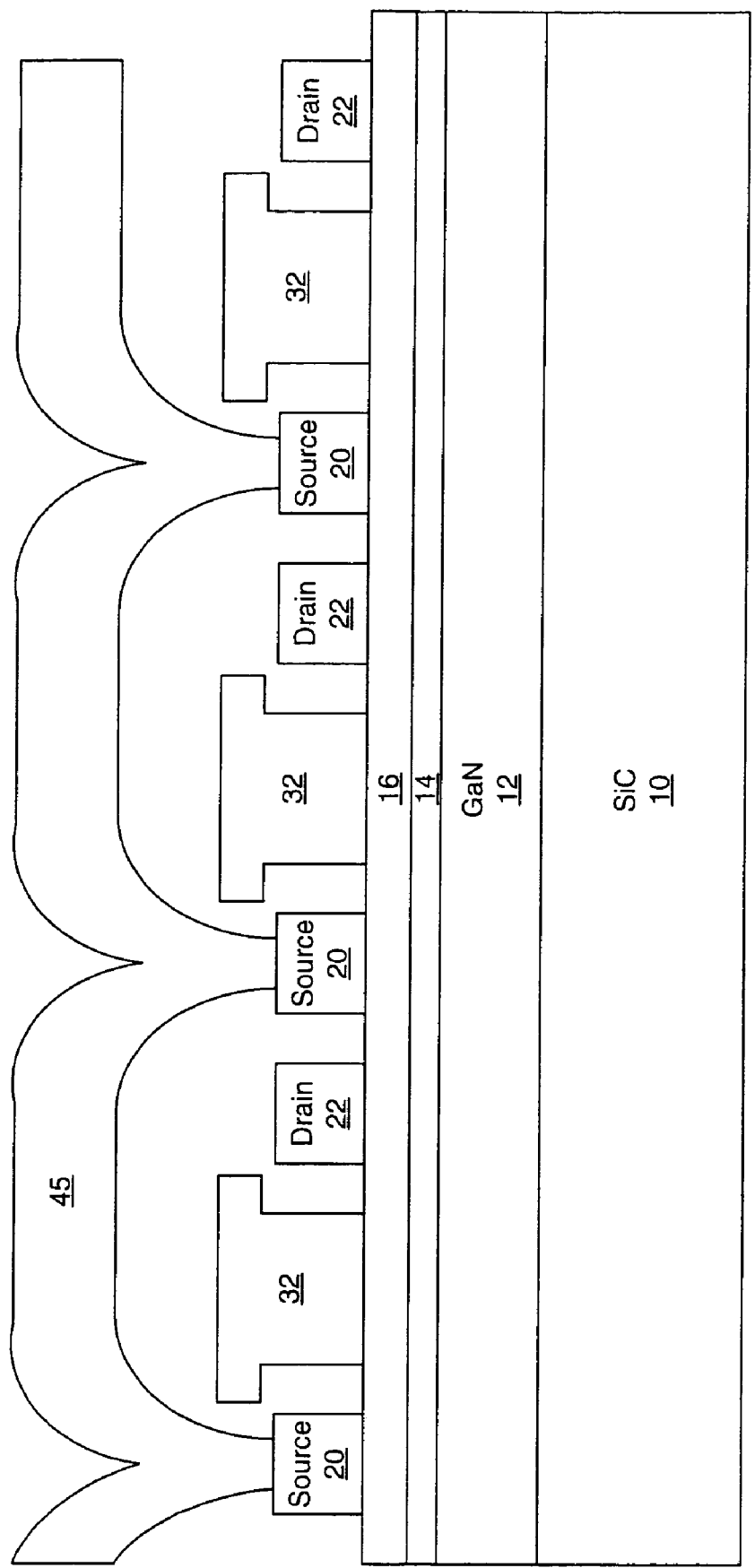
FIG. 1B is cross-section illustrating multiple unit cells and an air-bridge according to some embodiments of the present invention.

FIG. 1B is a cross-section illustrating multiple unit cells of transistors according to embodiments of the present invention. Referring now to FIGS. 1A and 1B, devices according to embodiments of the present invention include a large air-bridge structure 45 on the device. The air-bridge structure may provide low grounding inductance without adding the complications of a via etch. The ability to ground the source terminal of each sub-cell with minimum AC potential drop is important in maintaining high gain for large periphery devices at mm-wave frequencies. In other words, the air-bridge structure 45 may provide improved spreading of ground current and low source inductance without the use of a via hole.

Figure 2:
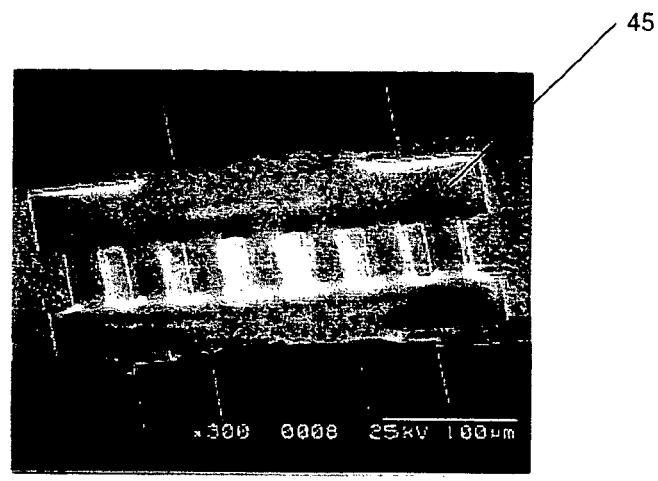
FIG. 2 is an SEM photograph illustrating a 1.05-mm-wide power GaN HEMT with an air-bridge structure according to some embodiments of the present invention.
Figure 3:
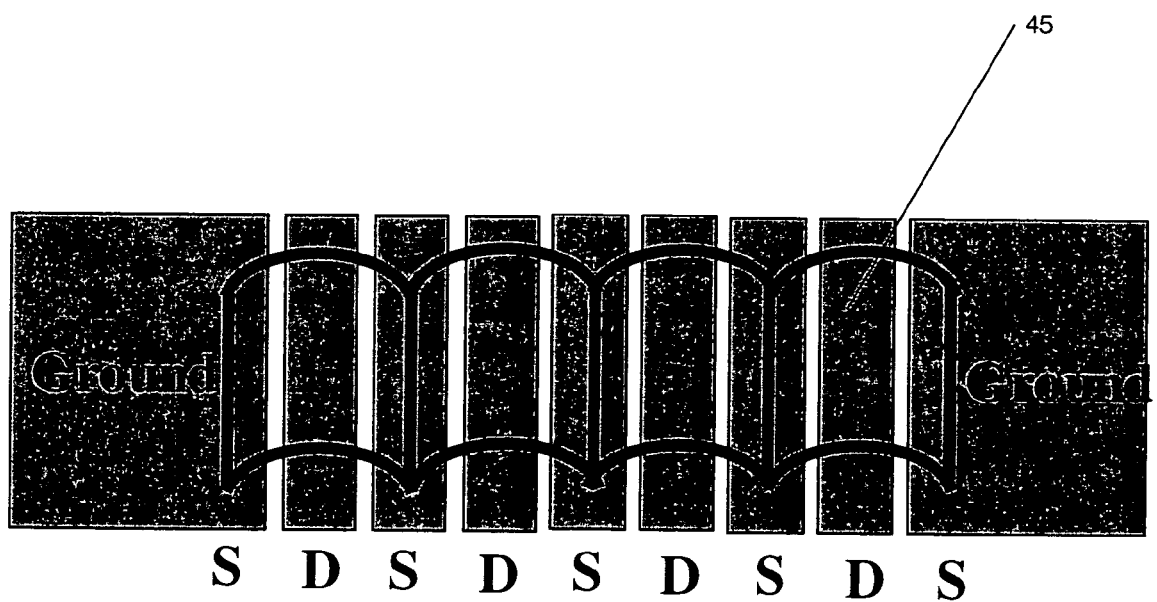
FIG. 3 is a layout diagram of transistors including an air-bridge structure according to some embodiments of the present invention.

FIG. 2 illustrates an SEM photo of a 1.05-mm-wide power GaN HEMT according to some embodiments of the present invention with an air-bridge structure 45 covering the full device (gate terminal on top). The air bridge structure 45 is further illustrated in FIG. 3. As the number of devices increases, the grounding inductance increases and each cell may see a different source inductance. Thus, device gain may deteriorate rapidly. The air-bridge structure 45 according to some embodiments of the present invention may allow the grounding inductance to be reduced.

Figure 4:
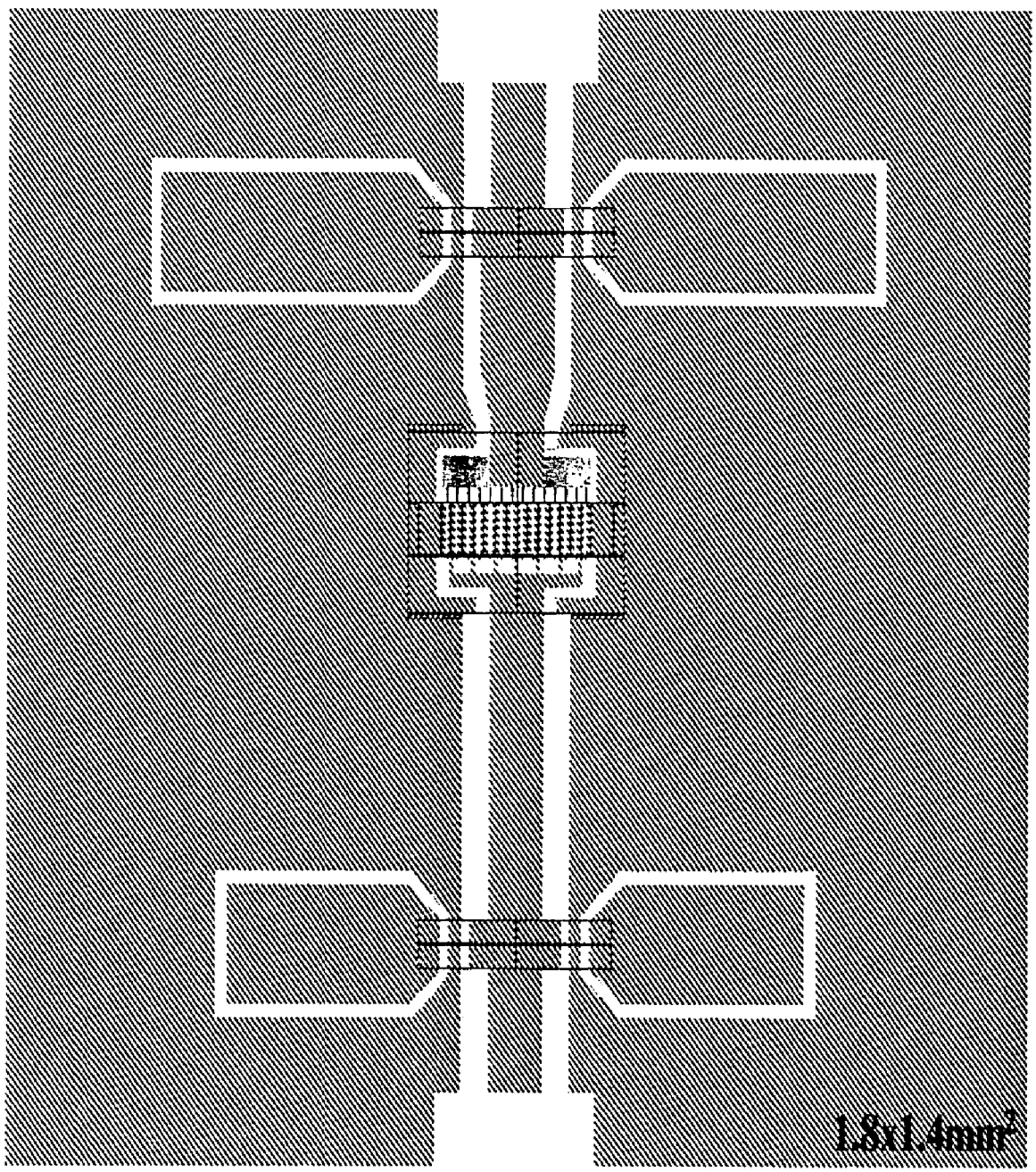
FIG. 4 is a diagram illustrating a layout design of transistors according to some embodiments of the present invention.

FIG. 4 illustrates a layout structure of devices according to some embodiments of the present invention. As discussed above, GaN HEMTs according to embodiments of the present invention are 1.05 mm wide by 1.44 $mm^2$. Parameters of the exemplary devices discussed herein include: an ohmic contact resistance of 0.5 Ω-mm, a peak transconductance of 260 mS/mm, and a maximum drain current density of from about 0.8 to about 1.2 A/mm. The gate-drain breakdown voltage was as high as 50 V. However, sub-threshold channel current increased at high drain voltages due to the short channel effect, which may limit useful swings in the I-V plane and lead to lower output power density as compared with devices with longer gate lengths.

Unless indicated otherwise, the devices discussed below with reference to FIGS. 5 through 12 are devices having the above described structure. Performance of exemplary devices as described herein will now be described. However, embodiments of the present invention should not be construed as limited to these particular devices but includes other devices capable of providing the performance characteristics described herein. Furthermore, while various theories of operation are described herein, embodiments of the present invention should not be construed as limited to a particular theory of operation.

Figure 5:
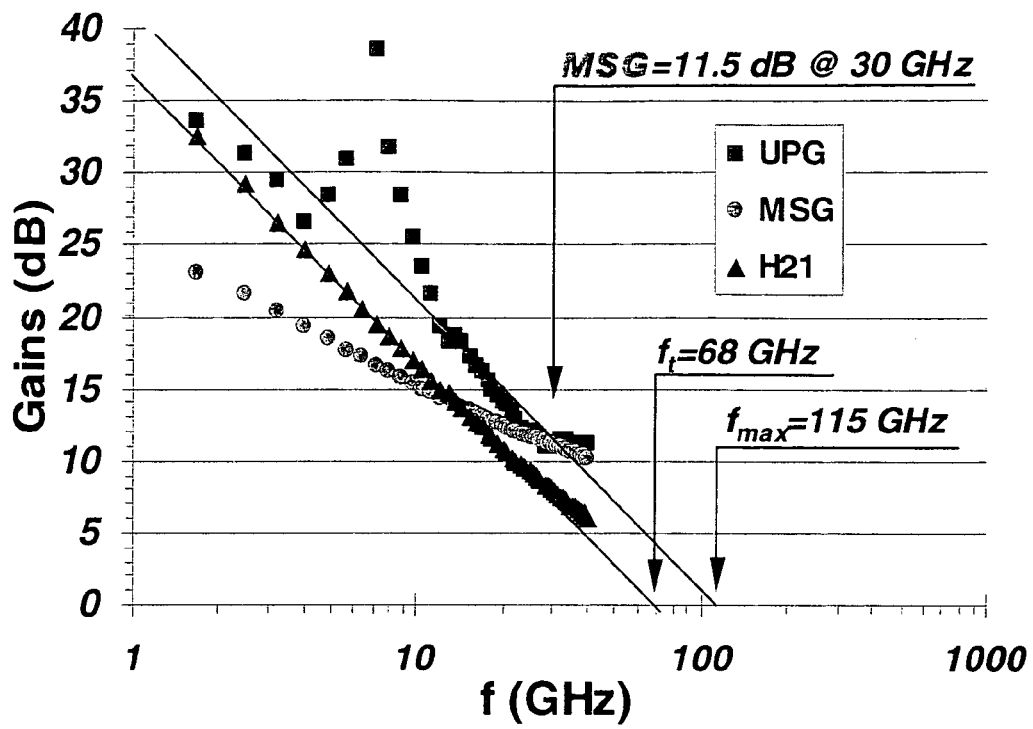
FIG. 5 is a gain plot of a 150×0.18 µm2AlGaN/GaN HEMT showing $f_t$ and $f_{max}$ of 68 GHz and 115 GHz.

The effectiveness of exemplary devices discussed herein was verified by direct comparison of a 2-finger, 150-μm-wide HEMT with the 14-finger, 1.05-mm-wide HEMT discussed herein at the same drain bias. Referring now to FIG. 5, a gain plot of a 150×0.18 μm2 AlGaN/GaN HEMT will be discussed. A plot of the gain characteristics of the 2-finger device at a drain bias of 10 V and current of 400 mA/mm is illustrated in FIG. 5. As illustrated therein, the 2-finger device exhibits a current gain cut off frequency $f_t$ of 68 GHz and a power gain cut-off frequency $f_{max}$ of 115 GHz. As further illustrated therein, the 2-finger device exhibits a maximum stable gain (MSG) at a frequency of about 30 GHz, which is from about 11 to about 11.5 dB.

Figure 6:
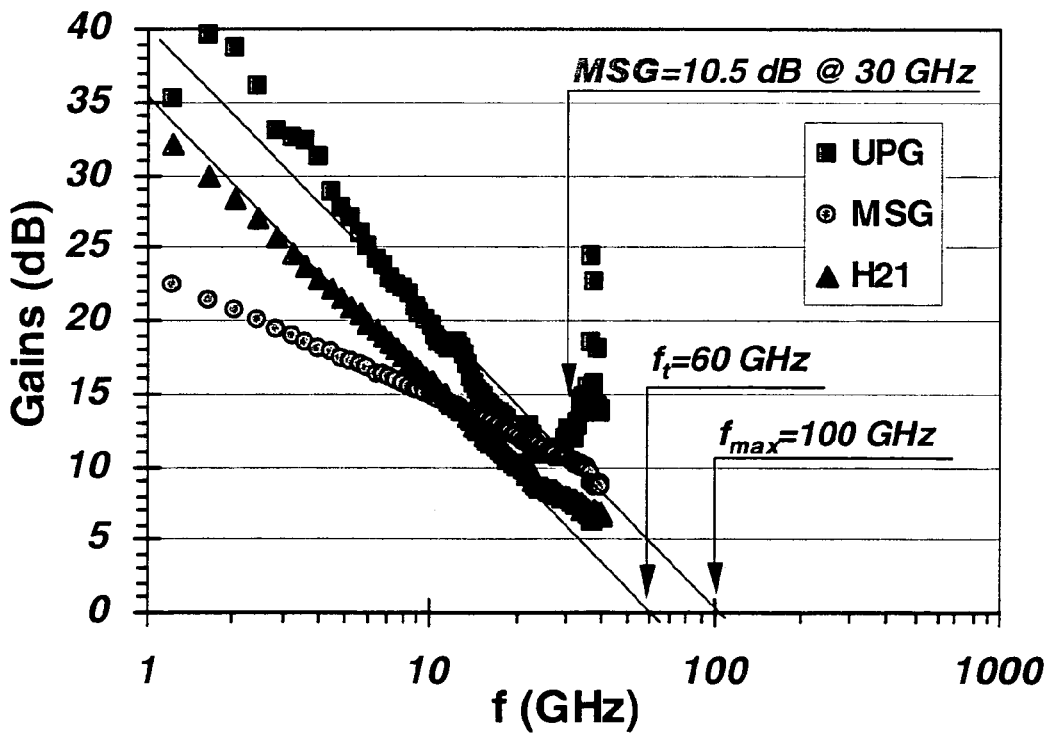
FIG. 6 is a gain plot of a 1050×0.18 µm² AlGaN/GaN HEMT according to some embodiments of the present invention showing $f_t$ and $f_{max}$ of 60 GHz and 100 GHz according to some embodiments of the present invention.

Referring now to FIG. 6, a gain plot of a 1050×0.18 μm² AlGaN/GaN HEMT according to exemplary embodiments of the present invention will be discussed. A plot of the gain characteristics of the 14-finger device according to embodiments of the present invention at a drain bias of 10 V and current of 400 mA/mm is illustrated in FIG. 6. As illustrated therein, the 14-finger device according to embodiments of the present invention, maintained a high current gain cut off frequency $f_t$ of 60 GHz and a high a power gain cut-off frequency $f_{max}$ of 100 GHz, as well as an MSG of 10.5 dB at 30 GHz. The ability to maintain a high MSG up to such a large device periphery is important for high power generation.

Amplifier performance will now be discussed with respect to devices according to exemplary embodiments of the present invention. Two amplifiers using single 1.05 mm-wide devices were designed based on a coplanar wave-guide (CPW) topology. Impedance matching was achieved with shunt stubs. The input was designed for low reflection while the output was optimized for power. The input was optimized for power based on measurements and large scale signal model calculations of previous devices. Amplifier-1 was designed to operate at a frequency of about 30 GHz and amplifier-2 was designed to operate at a frequency of about 35 GHz.

Figure 7:
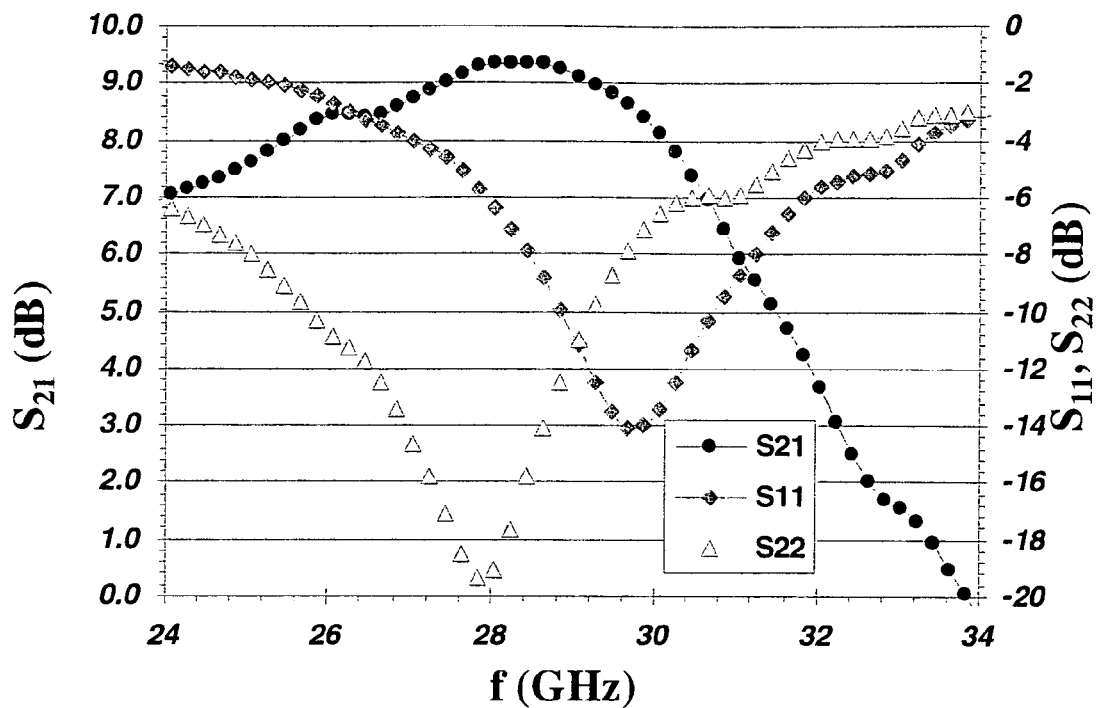
FIG. 7 is a plot illustrating transducer gain (S21) and reflection coefficients (S11 and S22) of amplifier-1, showing 8 dB gain at 30 GHz.

Referring now to FIG. 7, small-signal S-parameters for amplifier-1 (30 GHz) will be discussed. As illustrated in FIG. 7, transducer gain (S21) and reflection coefficients (S11 and S22) of amplifier-1 illustrate a gain of 8 dB at 30 GHz. These results apply to devices having a width of 1050 μm a bias of $I_d$=350 mA and $V_{ds}$=24 V. The output was optimized for power instead of reflection.

Figure 8:
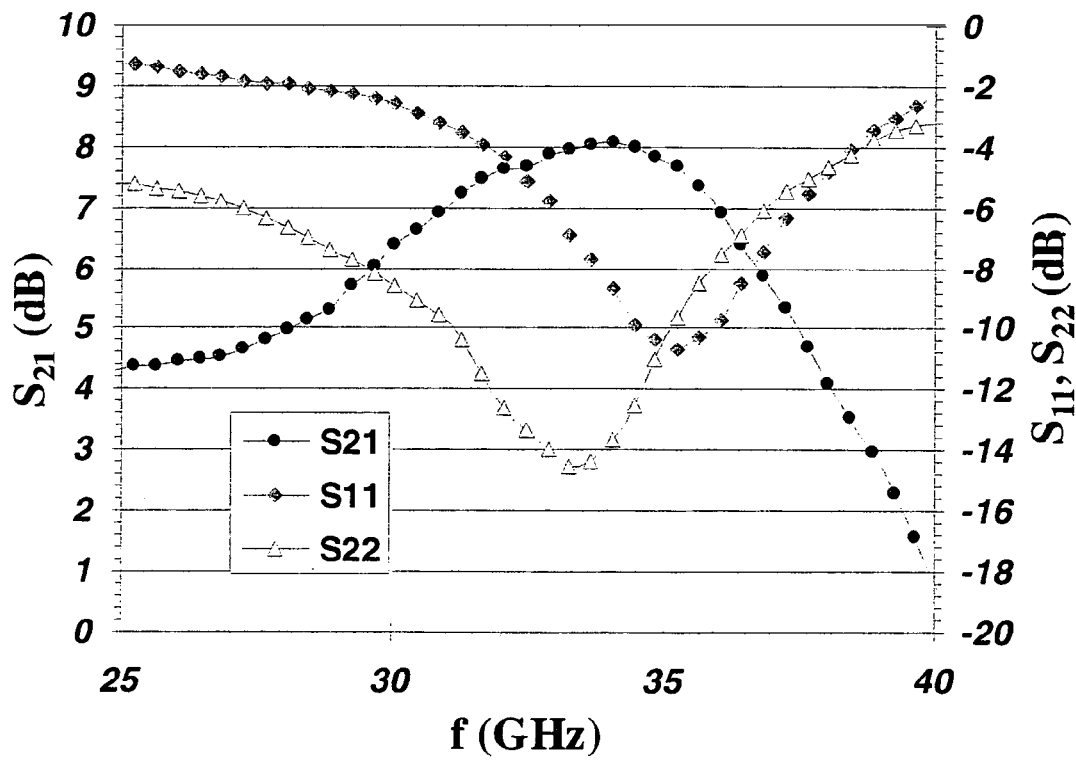
FIG. 8 is a plot illustrating transducer gain (S21) and reflection coefficients (S11 and S22) of amplifier-2, showing 7.5 dB gain at 35 GHz.

Referring now to FIG. 8, small-signal S-parameters for amplifier-2 (35 GHz) will be discussed. As illustrated in FIG. 8, transducer gain (S21) and reflection coefficients (S11 and S22) of amplifier-2 illustrate a gain of 7.5 dB at a frequency of 35 GHz. These results were achieved with exemplary devices having a device width of 1050 μm and a bias of $I_d$=350 mA and $V_{ds}$=24 V. The output was optimized for power instead of reflection.

Figure 9:
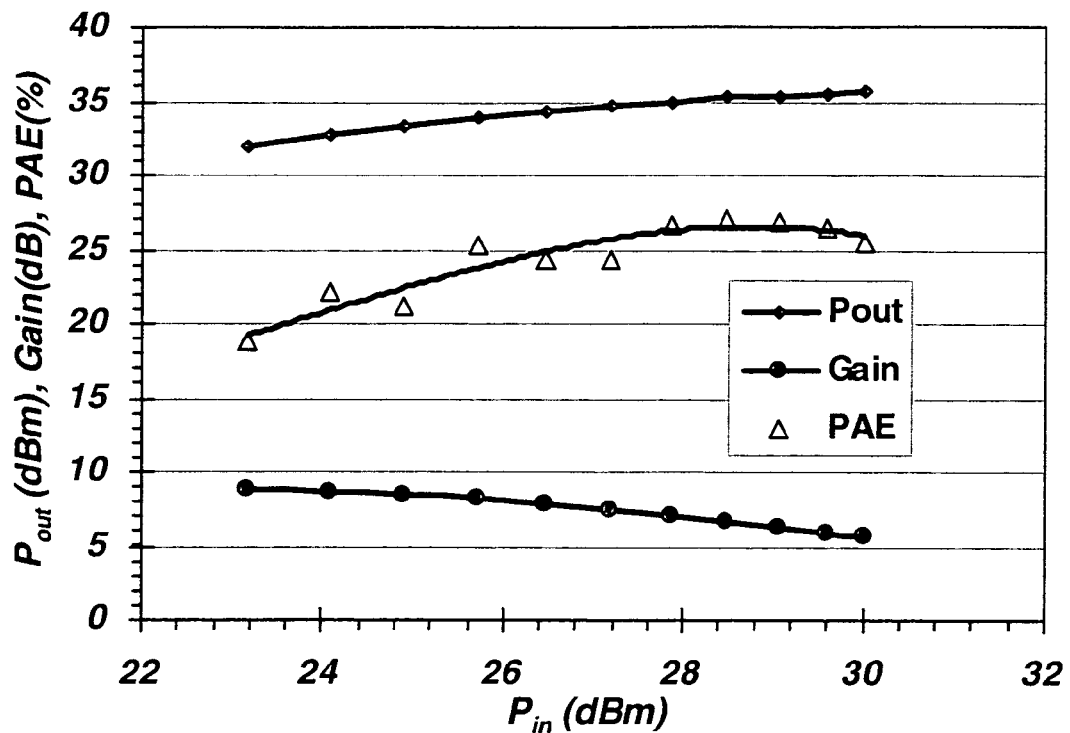
FIG. 9 is a plot illustrating a power sweep of mm-Wave amplifier-1 (30 GHz), showing output power of 3.64 W at 30 GHz with an associated gain and PAE of 6 dB and 26%, respectively, according to some embodiments of the present invention.
Figure 10:
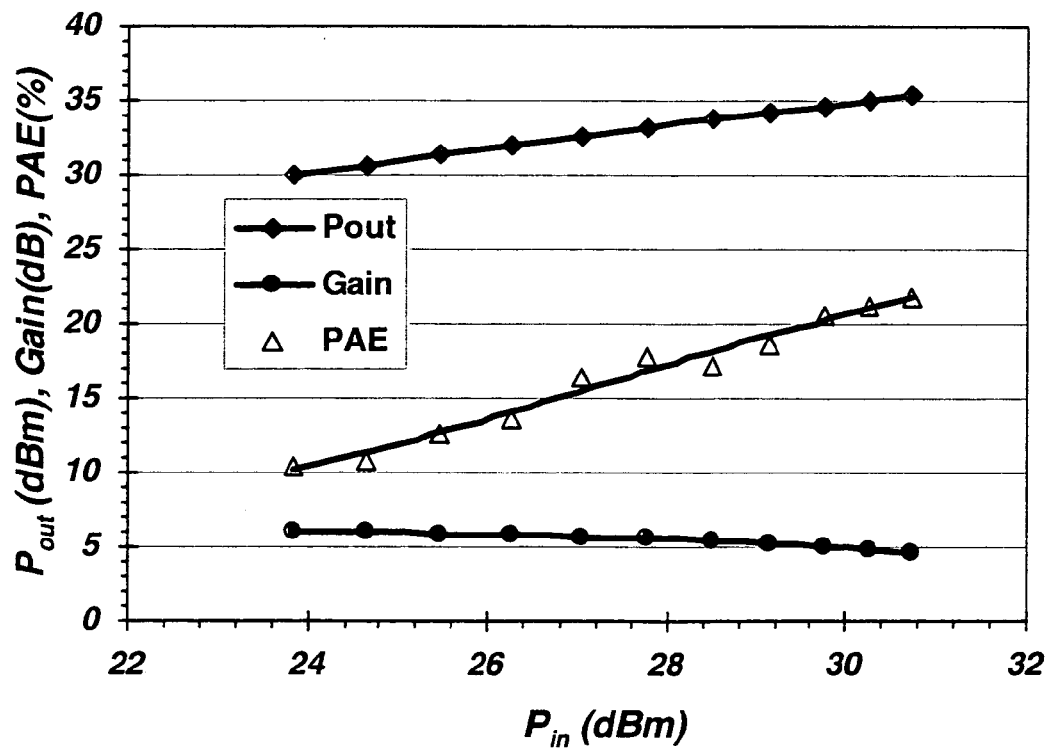
FIG. 10 is a plot illustrating a power sweep of mm-Wave amplifier-2 (35 GHz), showing output power of 3.45 W at 35 GHz with an associated gain and power added efficiency (PAE) of 4.9 dB and 22%, respectively, according to some embodiments of the present invention.

FIGS. 9 and 10 illustrate a power sweep of mm-Wave amplifiers 1 and 2, respectively, illustrating an output power of 3.64 W at 30 GHz and an output power of 3.45 W at 35 GHz, respectively. In particular, large-signal characterization was performed using a Focus load-pull system. The output mismatch of the amplifiers was measured to be from about 0.1 dB to about 0.5 dB. When this was adjusted by an output tuner, amplifier-1 (30 GHz) produced an output power of 3.64 W at 30 GHz with associated gain of 6 dB and power-added efficiency (PAE) of 26% as illustrated in FIG. 9, while amplifier-2 generated an output power of 3.45 W at 35 GHz with a gain of 4.9 dB and a PAE of 22% as illustrated in FIG. 10. Although performance was compromised due to the high sub-threshold current at high voltages as mentioned earlier, the output power showed great improvement over conventional transistors and is comparable to the output power of GaAs-based devices that are 6 to 7 times larger than the devices discussed herein. GaAs devices are discussed in *Fully Monolithic 4 Watt High Efficiency Ka-band Power Amplifier* by J. J. Komiak et al. (IEEE MTT-S International Microwave Symposium Digest, Vol. 3, pp. 947-950 (1999)).

Figure 11:
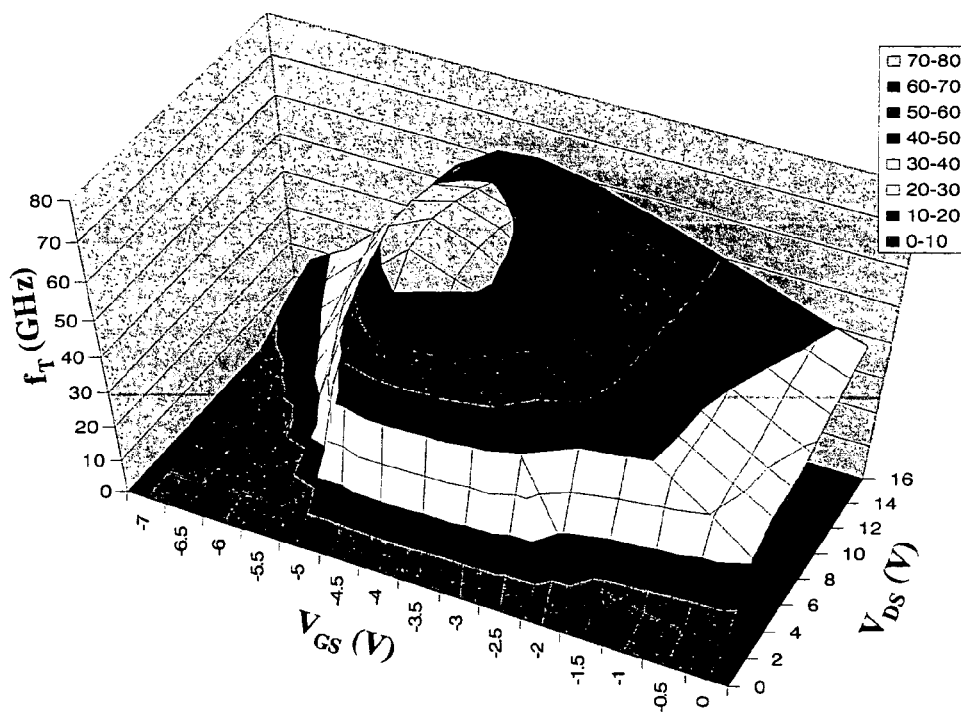
FIG. 11 is a three dimensional frequency ($F_t$) bias map of transistors according to some embodiments of the present invention.
Figure 12:
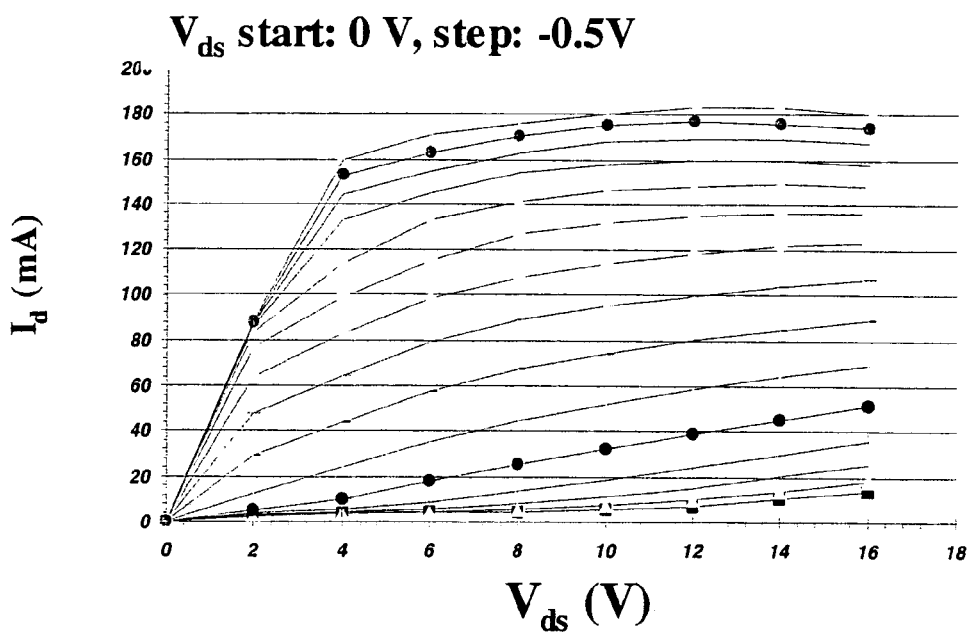
FIG. 12 is a graph illustrating $I_d$ (mA) v. $V_{ds}$ (V) associated with the bias map of FIG. 11 according to some embodiments of the present invention.

Referring now to FIGS. 11 and 12, an $F_t$ bias map and a plot of $I_d$ versus $V_{ds}$ illustrating a peak $f_t$ at ⅓ $I_{d,max}$ is illustrated. The low PAE discussed above achieved using exemplary devices discussed herein was due to the $f_T$ reduction at high current levels and poor pinch-off at high voltages from the short channel effect. As further illustrated by FIGS. 11 and 12, $f_t$ drops at high current levels, so when the device is operated under these conditions in response to a higher input drive, the $f_t$ and, therefore, gain, efficiency and linearity, degrades from what one would expect from a lower bias operating point. This has been shown to be a problem for high frequency large signal power operation.

As briefly discussed above with respect to FIGS. 1 through 12, a sub-0.2-μm gate length GaN HEMTs was successfully scaled up to a greater that 1 mm gate periphery with little loss in gain. Multi-Watt output power was generated at greater than 30 GHz using matching techniques. To reach the same power level with conventional GaAs-based devices, it would take a device periphery of 6 to 7 times larger and complicated power combining techniques.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

In the drawings and specification, there have been disclosed typical embodiments of the invention, and, although specific terms have been employed, they have been used in a generic and descriptive sense only and not for purposes of limitation.

That which is claimed is:

1. A high electron mobility transistor (HEMT), comprising:
a T-gate contact having a top portion and a base portion, a length of the top portion of the T gate contact being about 0.7 µm and a length of the base portion of the T gate contact being about 0.2 µm, wherein the HEMT has an output power of greater than 3.0 Watts when operated at a frequency of at least 30 GHz.

2. The HEMT of claim 1 having a power added efficiency (PAE) of at least about 20 percent.

3. The HEMT of claim 2 having a gain of at least about 7.5 dB.

4. The HEMI of claim 3 wherein the HEMT has a total width of less than about 6.0 mm.

5. The HEMT of claim 2 wherein the HEMT has a total width of less than about 6.0 mm.

6. The HEMT of claim 1 having a gain of at least about 7.5 dB.

7. The HEMT of claim 1 wherein the HEMT has a total width of less than about 6.0 mm.

8. The HEMT of claim 1 having an output power of at least about 3.6 Watts when operated at a frequency of about 30 GHz.

9. The HEMT of claim 8 having a power added efficiency (PAE) of at least about 26 percent and a gain of at least about 6 dB.

10. The HEMT of claim 1 having an output power of at least about 3.45 Watts when operated at a frequency of about 35 GHz.

11. The HEMT of claim 10 having a power added efficiency (PAE) of about 22 percent and a gain of at least about 4.9 dB.

12. The HEMT of claim 1, wherein the HEMT comprises a Group III-nitride based HEMT.

13. The HEMT of claim 1, wherein the HEMT comprises:
a GaN channel layer;
an AlN layer on the GaN channel layer;
an AlGaN layer on the AlN layer, wherein the T-gate contact is on the AlGaN layer;
an insulating layer on a surface of the HEMT; and
source and drain contacts on the AlGaN layer.

14. The HEMT of claim 13, wherein the insulating layer comprises a silicon nitride (SiN) passivation layer.

15. The HEMT of claim 13, wherein the HEMT further comprises an air-bridge on the HEMT.

16. The HEMT of claim 15, further comprising fourteen gate fingers.

17. The HEMT of claim 1, further comprising:
spaced apart source and drain contacts, the T-gate contact being between the source and drain contacts,
wherein a distance from the gate contact to the source contact is about 0.7 µm and wherein a distance from the gate contact to the drain contact is about 2.0 µm.

18. The HEMT of claim 1, wherein wings of the T-gate contact extend out about 0.25 µm from the base of the T-gate.

19. A field effect transistor (FET), comprising:
a T-gate contact having a top portion and a base portion, a length of the top portion of the T gate contact being about 0.7 µm and a length of the base portion of the T gate contact being about 0.2 µm, wherein the FET has a total width of less than about 6.0 mm and an output power greater than 3.0 Watts when operated at a frequency of at least 30 GHz.

20. The FET of claim 19, wherein the FET comprises a Group III-nitride based FET.

21. The FET of claim 20, wherein the FET comprises a high electron mobility transistor (HEMT).

22. The FET of claim 21 having a power added efficiency (PAE) of at least about 20 percent.

23. The FET of claim 21 having a gain of at least about 7.5 dB.

24. The FET of claim 21 having a gain of at least about 7.5 dB.

25. The FET of claim 21 having an output power of about 3.6 Watts when operated at a frequency of about 30 GHz.

26. The FET of claim 24 having a power added efficiency (PAE) of about 26 percent and a gain of at least about 6 dB.

27. The FET of claim 21 having an output power of about 3.45 Watts when operated at a frequency of about 35 GHz.

28. The FET of claim 27 having a power added efficiency (PAE) of about 22 percent and a gain of at least about 4.9 dB.

29. The FET of claim 21, wherein the FET comprises:
a GaN channel layer;
an AlN layer on the GaN channel layer;
an AlGaN layer on the AlN layer, wherein the T-gate contact is on the AlGaN layer;
an insulating layer on a surface of the FET; and
source and drain contacts on the AlGaN layer.

30. The FET of claim 29, wherein the insulating layer comprises a silicon nitride (SiN) passivation layer.

31. The FET of claim 29, wherein the FET further comprises an air-bridge on the FET.

32. The FET of claim 31, further comprising fourteen gate fingers.

33. The FET of claim 19, further comprising:
spaced apart source and drain contacts, the T-gate contact being between the source and drain contacts,
wherein a distance from the gate contact to the source contact is about 0.7 µm and wherein a distance from the gate contact to the drain contact is about 2.0 µm.

34. The FET of claim 19, wherein wings of the T-gate contact extend out about 0.25 µm from the base of the T-gate.

35. A field effect transistor (FET), comprising:
a T-gate contact having a top portion and a base portion, a length of the top portion of the T gate contact being about 0.7 µm and a length of the base portion of the T gate contact being about 0.2 µm, wherein the FET has a total width of less than about 6.0 mm and a gain of at least about 7.5 dB when operated at a frequency of greater than about 30 GHz.

36. The FET of claim 35, wherein the FET comprises a Group III-nitride based FET.

37. The FET of claim 36, wherein the FET comprises a high electron mobility transistor (HEMT).

38. The FET of claim 37 having a power added efficiency (PAB) of at least about 20 percent.

39. The FET of claim 38 having an output power of greater than 3.0 Watts.

40. The FET of claim 37 having an output power of greater than 3.0 Watts.

41. The FET of claim 37 having an output power of about 3.6 Watts when operated at a frequency of about 30 GHz.

42. The FET of claim 41 having a power added efficiency (PAE) of about 26 percent and a gain of at least about 6 dB.

43. The FET of claim 37 having an output power of about 3.45 Watts when operated at a frequency of about 35 GHz.

44. The FET of claim 43 having a power added efficiency (PAE) of about 22 percent and a gain of at least about 4.9 dB.

45. The FET of claim 44, wherein the FET further comprises an air-bridge on the FET.

46. The FET of claim 45, further comprising fourteen gate fingers.

47. The FET of claim 37, wherein the FET comprises:
a GaN channel layer;
an AlN layer on the GaN channel layer;
an AlGaN layer on the AlN layer, wherein the T-gate contact is on the AlGaN layer;
an insulating layer on a surface of the FET; and
source and drain contacts on the AlGaN layer.

48. The FET of claim 47, wherein the insulating layer comprises a silicon nitride (SiN) passivation layer.

49. The FET of claim 35, further comprising:
spaced apart source and drain contacts, the T-gate contact being between the source and drain contacts,
wherein a distance from the gate contact to the source contact is about 0.7 µm and wherein a distance from the gate contact to the drain contact is about 2.0 µm.

50. The FET of claim 35, wherein wings of the T-gate contact extend out about 0.25 µm from the base of the T-gate.

* * * * *

UNITED STATES PATENT AND TRADEMARK OFFICE
CERTIFICATE OF CORRECTION

PATENT NO. : 7,355,215 B2
APPLICATION NO. : 11/005423
DATED : April 8, 2008
INVENTOR(S) : Parikh et al.

Page 1 of 1

It is certified that error appears in the above-identified patent and that said Letters Patent is hereby corrected as shown below:

Column 11, Claim 4, Line 14: Please correct "The HEMI"
To read -- The HEMT --

Column 12, Claim 24, Line 7: Please correct "claim 21"
To read -- claim 22 --

Column 12, Claim 38, Line 52: Please correct "(PAB) of at least"
To read -- (PAE) of at least --

Signed and Sealed this

Eighth Day of July, 2008

JON W. DUDAS
*Director of the United States Patent and Trademark Office*